(12) United States Patent
Liwinski

(10) Patent No.: US 7,292,104 B1
(45) Date of Patent: Nov. 6, 2007

(54) VARIABLE GAIN AMPLIFIER

(75) Inventor: Henry Z. Liwinski, North Wales, PA (US)

(73) Assignee: Anadigics, Inc., Warren, NJ (US)

( * ) Notice: Subject to any disclaimer, the term of this patent is extended or adjusted under 35 U.S.C. 154(b) by 85 days.

(21) Appl. No.: 11/057,304

(22) Filed: Feb. 11, 2005

(51) Int. Cl.
*H03G 3/12* (2006.01)

(52) U.S. Cl. .................. 330/283; 330/285; 330/296

(58) Field of Classification Search ............. 330/283, 330/285, 296
See application file for complete search history.

(56) References Cited

U.S. PATENT DOCUMENTS

| | | | |
|---|---|---|---|
| 6,175,279 B1 * | 1/2001 | Ciccarelli et al. ......... | 330/296 |
| 6,693,492 B2 * | 2/2004 | Desize ..................... | 330/283 |
| 6,753,734 B2 * | 6/2004 | Arell et al. .............. | 330/296 |
| 6,859,105 B2 * | 2/2005 | Ahn ........................ | 330/302 |
| 7,034,606 B2 * | 4/2006 | Caresosa et al. ......... | 327/563 |

* cited by examiner

*Primary Examiner*—Robert Pascal
*Assistant Examiner*—Hieu Nguyen
(74) *Attorney, Agent, or Firm*—Morgan, Lewis & Bockius LLP

(57) ABSTRACT

A variable gain amplifier is disclosed where the gain of the amplifier is controlled by a variable emitter resistor that is responsive to a control signal. The variable resistor includes a resistor connected between the collector and emitter of a control transistor. A control signal applied to the base of the control transistor varies the gain of the amplifier from a minimum gain when the control transistor is cut-off to a maximum gain when the control transistor is saturated.

5 Claims, 5 Drawing Sheets

VARIABLE GAIN AMPLIFIER

BACKGROUND OF THE INVENTION

The present invention relates to radio frequency amplifiers. More specifically, the invention relates to RF amplifiers with variable gain.

GSM for cellular phones typically control power output by applying a control voltage (0-2 V) to control an amplifier's bias circuit. But power output is a nonlinear function of control voltage. At low power, the output power is very sensitive to small changes in the control voltage. Therefore, there remains a need for a system and method for linearizing the power output as a function of control voltage.

SUMMARY OF THE INVENTION

A variable gain amplifier is disclosed where the gain of the amplifier is controlled by a variable emitter resistor that is responsive to a control signal. The variable resistor includes a resistor connected between the collector and emitter of a control transistor. A control signal applied to the base of the control transistor varies the gain of the amplifier from a minimum gain when the control transistor is cut-off to a maximum gain when the control transistor is saturated.

One embodiment of the present invention is directed to a variable gain amplifier comprising: an amplifying transistor having a base, an emitter, and a collector; a biasing network connected to the base of the amplifying transistor; and a variable resistor connected between the emitter of the amplifying transistor and ground, the variable resistor responsive to a control signal. In some embodiments, the variable resistor further comprises: a resistor connected between the emitter of the amplifying transistor and ground; and a second transistor having a base, an emitter, and a collector, the collector of the second transistor connected to the emitter of the amplifying transistor and the emitter of the second transistor connected to ground, the base of the second transistor configured to receive the control signal, wherein the gain of the amplifier is controlled by the control signal.

Another embodiment of the present invention is directed to a method of setting the gain of an amplifier comprising: providing an amplifying transistor having an emitter, the emitter connected to a ground through a variable resistor having a control signal port; and applying a control signal to the control signal port, the control signal affecting a current through the variable resistor and setting the gain of the amplifying transistor.

BRIEF DESCRIPTION OF THE DRAWINGS

The invention will be described by reference to the preferred and alternative embodiments thereof in conjunction with the drawings in which.

DETAILED DESCRIPTION

Figure 1:
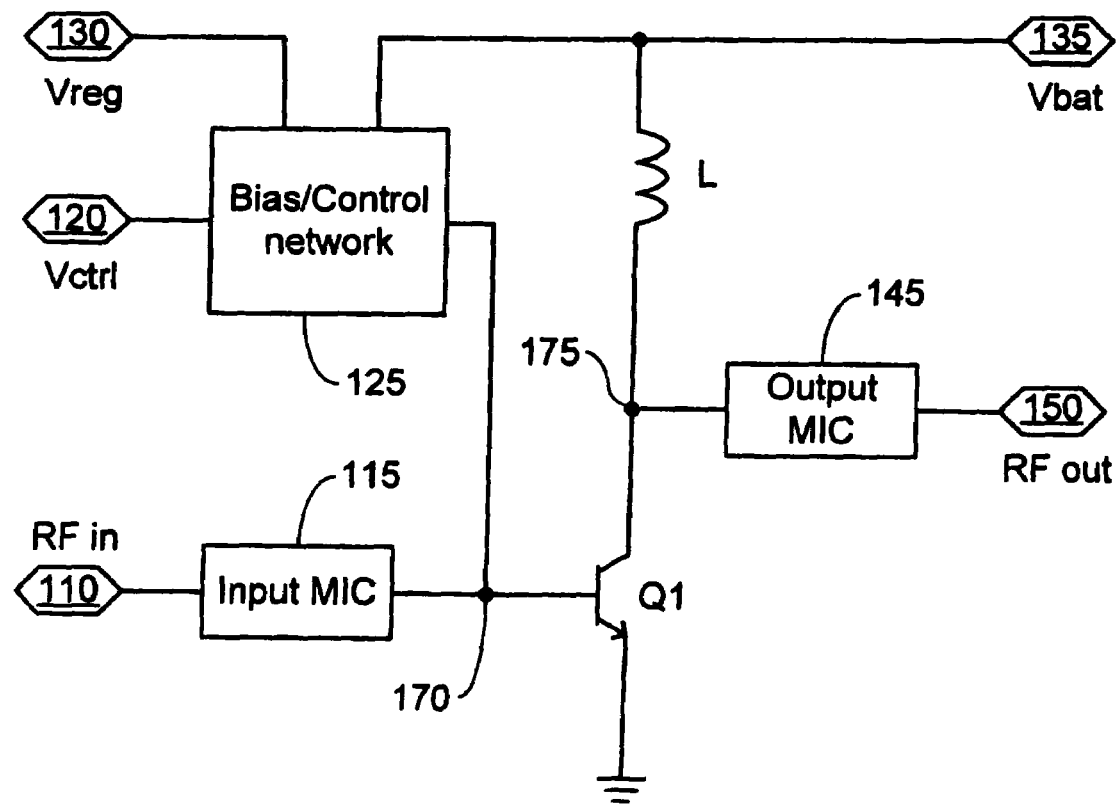
FIG. 1 is a schematic diagram of a typical fundamental amplifier block for RF applications.

FIG. 1 is a schematic diagram of a typical power amplifier. In FIG. 1, transistor, Q1, is a heterojunction bipolar transistor (HBT) with its emitter connected to ground. Other transistors, such as, for example, an FET or BJT may also be used in the power amplifier and are within the scope of the present invention. Furthermore, the power amplifier of FIG. 1 may be incorporated as an amplifier stage in a multi-stage power amplifier and is also within the scope of the present invention. A base of the HBT is connected to node 170 and receives an input RF signal from input port 110 through matching impedance circuit 115. An output RF signal is extracted at RF output port 150 from a collector of the HBT through an output matching impedance circuit 145. The output matching impedance circuit 145 is connected to the collector of the HBT at node 175. A power supply, such as a battery, at port 135 is connected to node 175 through an inductor, L.

Bias current is applied to the base of the HBT from a bias/gain control network 125. The bias/gain control network is connected to the power supply at port 135 and to a regulated voltage, Vreg, through port 130. Control signal, Vctrl, is input at control port 120 into the bias/gain control network 125. At low power, the output RF signal is very sensitive to small changes in the control signal, Vctrl.

Figure 2:
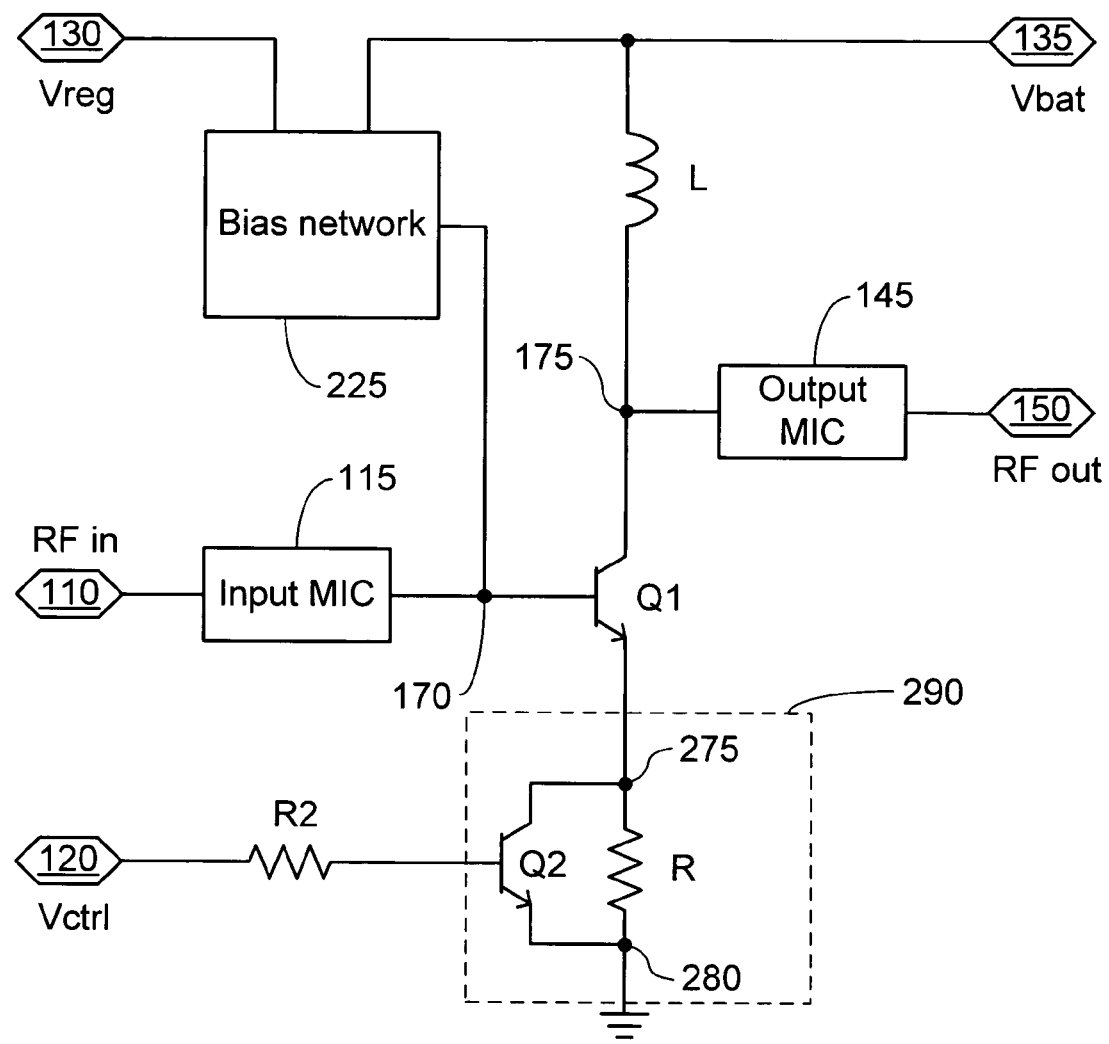
FIG. 2 is a schematic diagram of one embodiment of the present invention.

FIG. 2 is a schematic diagram of one embodiment of the present invention wherein structures identical to the structures shown in FIG. 1 are indicated by the same reference number. A gain of the amplifying transistor, Q1, is controlled by a variable resistor 290 connected between an emitter of the amplifying transistor, Q1, and ground. In a preferred embodiment Q1 may be an HBT and the amplifier shown in FIG. 2 may be an input amplifier stage for a GSM amplifier. Variable resistor 290 includes a resistor, R, in parallel with control transistor, Q2. Control port 120 receives a control signal that is applied to a base of the control transistor, Q2, through resistor R2. The value of R2 may be selected to saturate Q2 when a maximum value of Vctrl is applied at control port 120.

Bias network 225 may be any suitable circuit that provides the desired bias to the amplifying transistor, Q1. For example, U.S. Pat. No. 6,515,546 issued on Feb. 4, 2003 to Liwinski, hereby incorporated by reference in its entirety, discloses a bias circuit that may be used to bias Q1. Other bias circuits such as the ones disclosed in U.S. Pat. No. 6,753,734 issued on Jun. 22, 2004 to Arell et al., or U.S. Patent Publication No. 2003/0155977 filed on Dec. 13, 2002, currently issued as U.S. Pat. No. 6,842,075 on Jan. 11, 2005 to Johnson et al, both hereby incorporated by reference in their entirety, may also be used to bias Q1.

The operation of the variable resistor 290 is now described by first noting that when control transistor, Q2, is off, the effective resistance of the variable resistor 290 is R. As the control signal, Vctrl, increases, a base-emitter junction of Q2 becomes forward biased and Q2 moves into an active mode and a collector current of Q2 increases. In the active mode, a small increase in Vctrl causes a large increase in the collector current of Q2. This, in turn, decreases the effective resistance of variable resistor 290 and increases the gain of the amplifying transistor, Q1. When Vctrl is sufficiently large to cause Q2 to saturate, the collector current through Q2 is maximum and the gain of the amplifying transistor is maximum.

In a preferred embodiment, input power to power amplifier Q1 may be kept relatively constant and high enough to ensure that the power amplifier is at its maximum efficiency at full output power. Power control may be implemented by controlling the bias or power supply. Variable resistor 290 provides finer control over low output power levels. If used on the front stage or stages of a multi-stage GSM power amplifier, variable resistor 290 acts like a valve to the high power input RF signal thereby allowing fine power control at low output power levels while preventing self-biasing of the front stage amplifying transistor and possibly subsequent stages of the multi-stage power amplifier.

In a preferred embodiment, R is selected to prevent self-biasing of Q1 which occurs when the input RF signal is sufficient to forward bias the base-emitter junction of Q1 and turn Q1 on. In cellular phones, the selection of R is complicated by the fact that the level of input power may vary from phone to phone even though the input RF signal power is substantially constant. The input power level is usually determined by the voltage controlled oscillator (VCO) used in each phone. Each VCO provides a constant input power to the amplifier but the level of input power may vary by about 5 dB from VCO to VCO. For example, in a GSM phone, the power level of the input RF signal may be between 0-5 dB depending on the VCO used in phone. In the instant example, R may be selected to prevent turn on of Q1 even if the VCO in the phone provides a 5 dBm input RF signal to the amplifier in the phone. Connecting the control transistor in parallel with R results in an effective emitter resistance that may be varied by applying a control signal to the base of the control resistor. The effective emitter resistance determines the gain of the amplifying transistor Q1. Therefore, the gain of Q1 may be controlled by the control signal applied to the base of the control transistor Q2.

Figure 3:
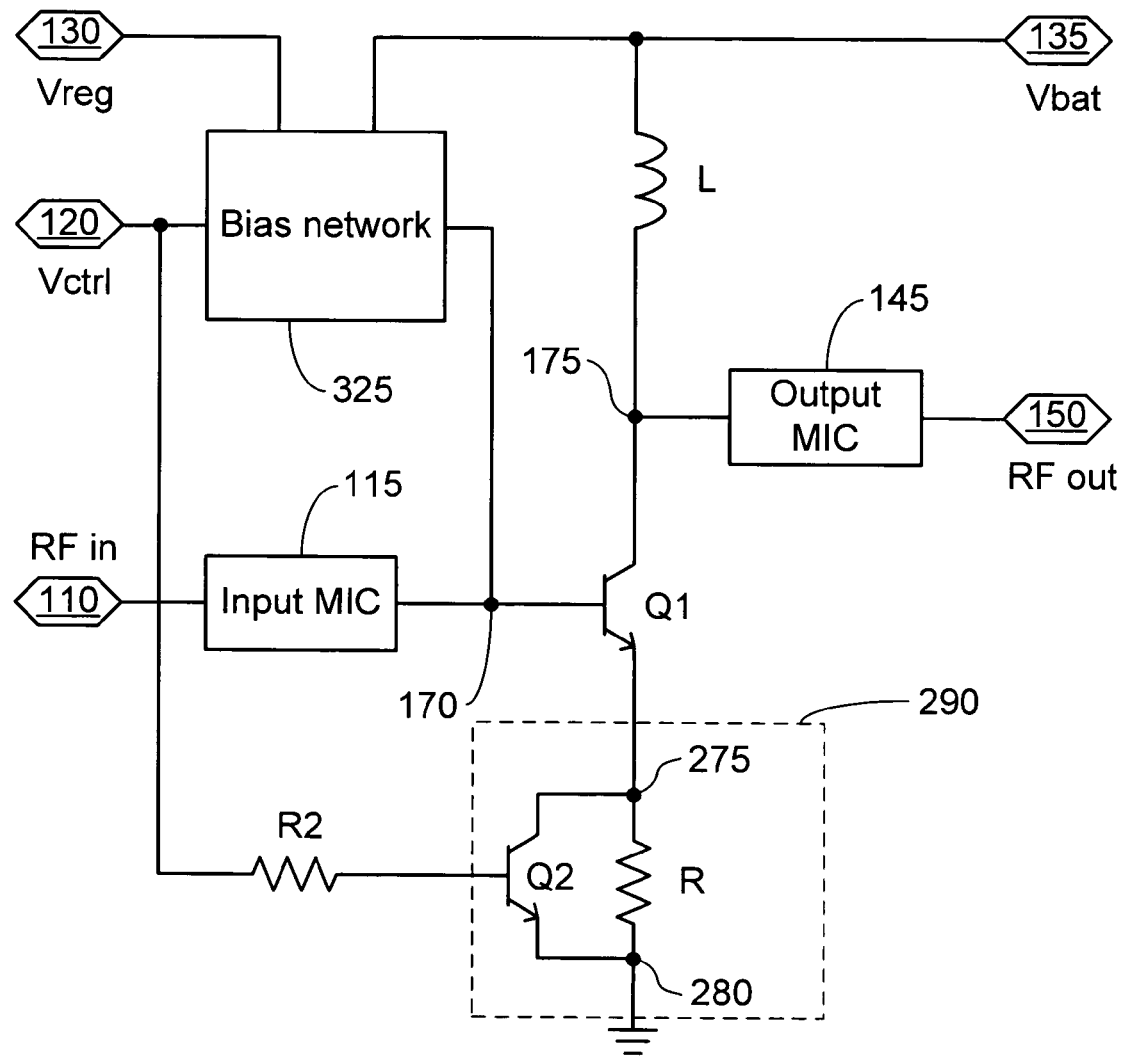
FIG. 3 is a schematic diagram of another embodiment of the present invention.

FIG. 3 is a schematic diagram of another embodiment of the present invention wherein structures identical to the structures shown in FIG. 2 are indicated by the same reference number. In FIG. 3, output power of the power amplifier may be controlled through bias adjustment and variable resistor 290 through a control signal, Vctrl, that is applied to the variable resistor 290 and the bias network 325. The operation of the amplifier shown in FIG. 3 is similar to the circuit of FIG. 2 except that the bias network 325 is also responsive to Vctrl.

Figure 4:
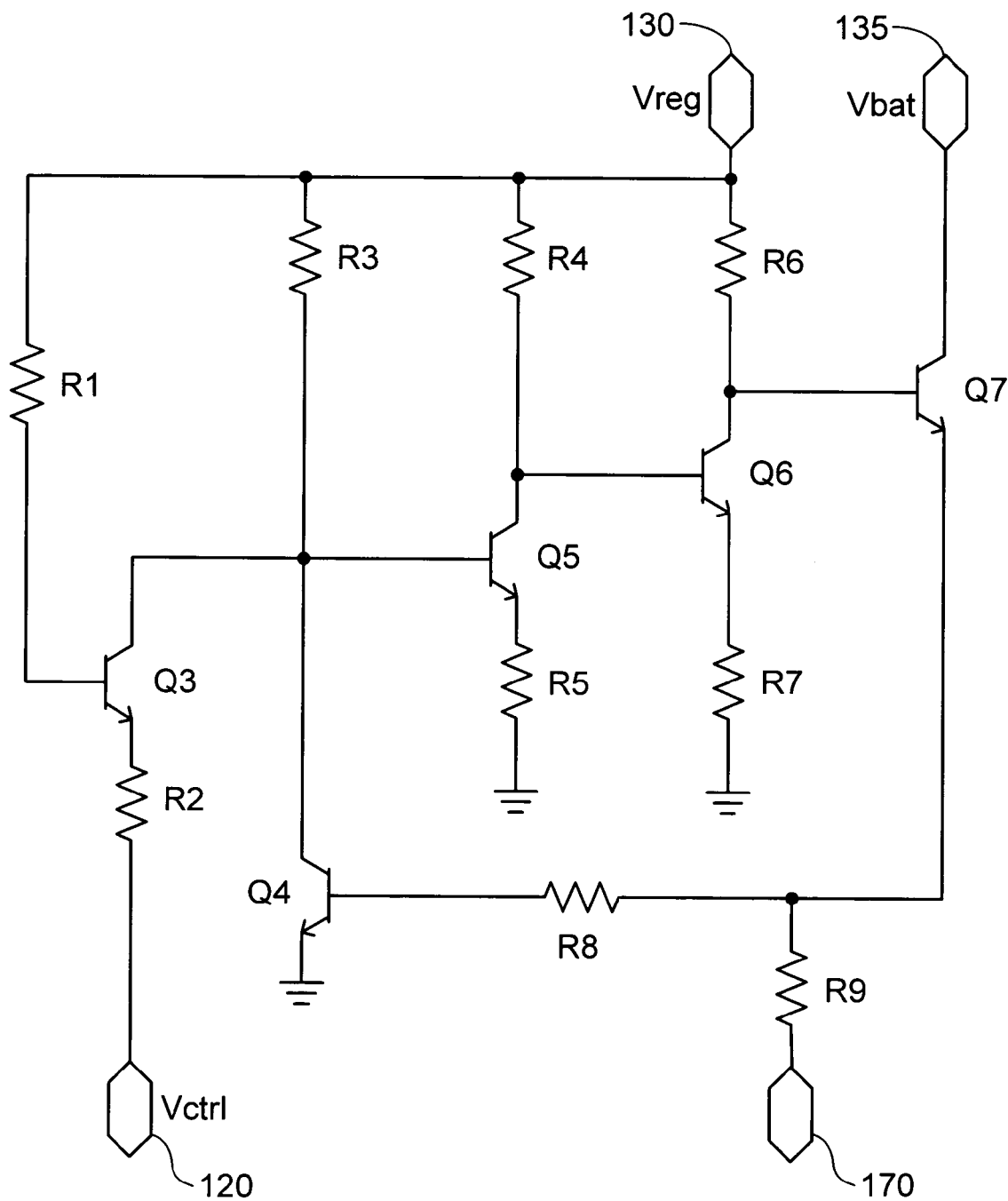
FIG. 4 is a schematic diagram of a base biasing network that may be used in the embodiment shown in FIG. 3.

FIG. 4 is a schematic diagram of one embodiment of the bias network shown in FIG. 3 wherein structures identical to the structures shown in FIG. 3 are indicated by the same reference number. In FIG. 4, identical structures are indicated by the same reference number. Transistors Q4 form a current mirror with HBT Q1 (not shown in FIG. 4) that provides a defined current to the base of Q1 through node 170. Transistors Q5 and Q6 provide gain to a loop containing Q4, Q5, Q6, and Q7 that may enhance temperature stability of the bias network and reduce sensitivity to variations in Vreg. Bias control transistor, Q3, is responsive to a control signal applied to an emitter of Q3 through control port 120. Resistors R1 and R2 are selected such that Q3 is saturated when the control signal is 0 volts or at its minimum value and Q3 is off when the control signal is 2 volts or at its maximum value. When the control signal is at its minimum value, Q3 is saturated causing a voltage at a collector of Q3 to decrease, which also decreases the voltage at a base of Q5 such that Q5 and Q7 turn off and reduces a bias current provided to node 170 to zero. When the control signal is at its maximum value, Q3 is off and the bias network provides a maximum bias current to node 170.

Figure 5:
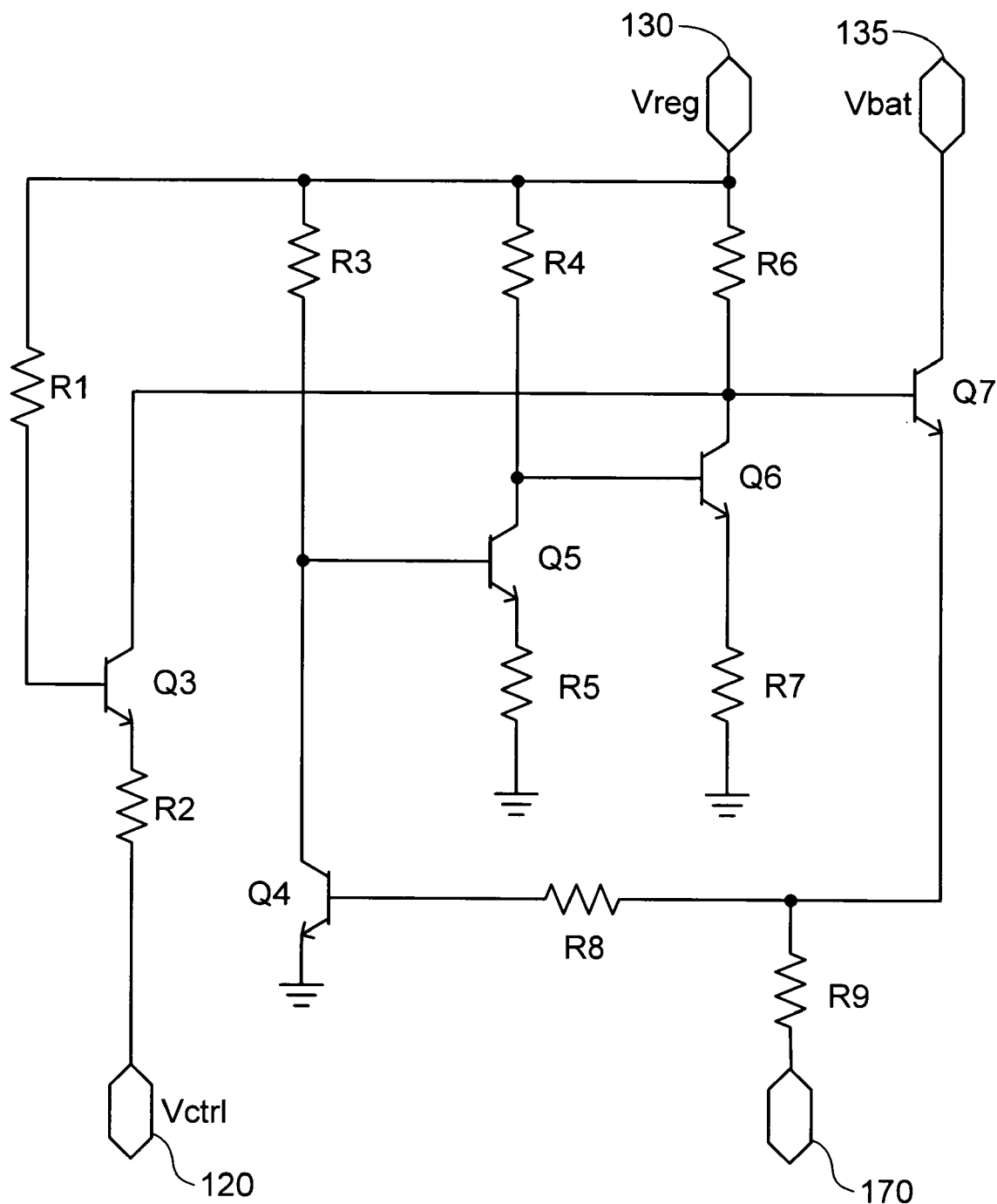
FIG. 5 is a schematic diagram of another base biasing network that may be used in the embodiment shown in FIG. 3.

FIG. 5 is a schematic diagram of another embodiment of the bias network shown in FIG. 3. FIG. 5 is similar to FIG. 4 except that the collector of bias control transistor, Q3, is directly connected to a base of emitter follower transistor, Q7. The operation of the circuit in FIG. 5 is similar to that of FIG. 4, except that the bias control transistor, Q3, directly controls the operation of Q7.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. A variable gain amplifier, comprising:
an amplifying transistor having a base, an emitter, and a collector;
a biasing network connected to the base of the amplifying transistor wherein the biasing network forms a current mirror with the amplifying transistor; and
a variable resistor connected between the emitter of the amplifying transistor and ground wherein the variable resistor further comprises:
a resistor connected between the emitter of the amplifying transistor and ground; and
a second transistor having a base, an emitter, and a collector, the collector of the second transistor connected to the emitter of the amplifying transistor, the emitter of the second transistor connected to ground, the base of the second transistor configured to receive the control signal, wherein the gain of the amplifier is controlled by the control signal.

2. The variable gain amplifier of claim 1 wherein the biasing network is controlled by the control signal.

3. A method of setting the gain of an amplifier, comprising:
providing an amplifying transistor having an emitter, the emitter connected to a ground through a variable resistor having a control signal port;
biasing the base of the amplifying transistor using a transistor that forms a current mirror with the amplifying transistor; and
applying a control signal to the control signal port, the control signal affecting a current through the variable resistor and setting the gain of the amplifying transistor wherein the variable resistor further comprises:
a resistor connected between the emitter of the amplifying transistor and ground; and
a second transistor having a base, an emitter, and a collector, the collector of the second transistor connected to the emitter of the amplifying transistor, the emitter of the second transistor connected to ground, the base of the second transistor configured to receive the control signal, wherein the gain of the amplifier is controlled by the control signal.

4. The method of claim 3 further comprising the step of controlling the current mirror with the control signal.

5. A variable gain amplifier, comprising:
an amplifying transistor having a base, an emitter, and a collector;
a biasing network connected to the base of the amplifying transistor wherein the biasing network forms a current mirror with the amplifying transistor and is responsive to a control signal;

an emitter resistor having a first resistor lead connected to the emitter of the amplifying transistor and a second lead connected to ground; and a control transistor having a base, an emitter, and a collector, the collector of the control transistor connected to the emitter of the amplifying transistor, the emitter of the control transistor connected to ground, the base of the control transistor configured to receive the control signal wherein a gain of the amplifying transistor is responsive to the control signal.

* * * * *